United States Patent
Sugiura et al.

(10) Patent No.: US 7,247,921 B2
(45) Date of Patent: Jul. 24, 2007

(54) SEMICONDUCTOR APPARATUS AND METHOD OF MANUFACTURING SAME, AND METHOD OF DETECTING DEFECTS IN SEMICONDUCTOR APPARATUS

(75) Inventors: Masayuki Sugiura, Kanagawa-ken (JP); Yasuhiko Kuriyama, Kanagawa-ken (JP); Toru Sugiyama, Tokyo (JP); Yoshikazu Tanabe, Kanagawa-ken (JP); Makoto Shibamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/148,331

(22) Filed: Jun. 9, 2005

(65) Prior Publication Data

US 2005/0275076 A1    Dec. 15, 2005

(30) Foreign Application Priority Data

Jun. 10, 2004  (JP)  ............................. 2004-172452

(51) Int. Cl.
*H01L 29/06*  (2006.01)

(52) U.S. Cl. ............................. 257/494; 257/E29.012; 257/104; 257/107; 257/509; 257/48; 438/140; 438/458

(58) Field of Classification Search ........ 257/E29.225, 257/E29.012, E29.013, E29.12, 619, 620, 257/678, 758, 104, 107, 119, 509, 48, 494; 438/140, 458, FOR. 101, 18, FOR. 142
See application file for complete search history.

(56) References Cited

U.S. PATENT DOCUMENTS

| | | | | |
|---|---|---|---|---|
| 3,312,882 A | * | 4/1967 | Pollock | ........................ 257/500 |
| 4,786,958 A | * | 11/1988 | Bhagat | ........................ 257/137 |
| 4,819,044 A | * | 4/1989 | Murakami | ................... 257/336 |
| 5,071,770 A | * | 12/1991 | Kolesar, Jr. | .................. 436/151 |
| 5,087,579 A | * | 2/1992 | Tomassetti | ................... 438/208 |
| 5,089,427 A | * | 2/1992 | Schoenberg | ................. 438/545 |
| 5,385,097 A | | 1/1995 | Hruska et al. | ............ 102/202.5 |
| 5,723,875 A | | 3/1998 | Abe et al. | ...................... 257/48 |
| 5,804,868 A | * | 9/1998 | Kobayashi et al. | ......... 257/630 |
| 5,886,381 A | * | 3/1999 | Frisina | ........................ 257/328 |

(Continued)

FOREIGN PATENT DOCUMENTS

JP          6-77300          3/1994

(Continued)

*Primary Examiner*—Kenneth Parker
*Assistant Examiner*—Chris C. Chu
(74) *Attorney, Agent, or Firm*—Oblon, Spivak, McClelland, Maier & Neustadt, P.C.

(57) ABSTRACT

A semiconductor apparatus includes a semiconductor substrate having a device region and a periphery region surrounding the device region; a semiconductor device provided in the device region of the semiconductor substrate; a first electrode pad provided on the semiconductor substrate; a second electrode pad provided on the semiconductor substrate; a strip-like, first conductivity type semiconductor pattern; and a strip-like, second conductivity type semiconductor pattern. The strip-like, first conductivity type semiconductor pattern extends in the periphery region of the semiconductor substrate, and the first electrode pad is electrically connected to one end of the first conductivity type semiconductor pattern. The strip-like, second conductivity type semiconductor pattern constitutes a p-n junction in conjunction with the first conductivity type semiconductor pattern. The first and second electrode pads are electrically connected to both ends of the second conductivity type semiconductor pattern.

15 Claims, 15 Drawing Sheets

U.S. PATENT DOCUMENTS

| | | | |
|---|---|---|---|
| 6,376,920 B1* | 4/2002 | Ikegami et al. | 257/786 |
| 6,580,121 B2* | 6/2003 | Hisamoto | 257/328 |
| 6,686,750 B2* | 2/2004 | Watanabe et al. | 324/691 |
| 7,087,496 B2* | 8/2006 | Gutierrez | 438/294 |
| 2004/0061193 A1* | 4/2004 | Toyoda et al. | 257/433 |

FOREIGN PATENT DOCUMENTS

| | | |
|---|---|---|
| JP | 6-244254 | 9/1994 |
| JP | 6-347509 | 12/1994 |
| JP | 2000294778 A * | 10/2000 |

* cited by examiner

SEMICONDUCTOR APPARATUS AND METHOD OF MANUFACTURING SAME, AND METHOD OF DETECTING DEFECTS IN SEMICONDUCTOR APPARATUS

CROSS-REFERENCE TO RELATED APPLICATIONS

This application is based upon and claims the benefit of priority from the prior Japanese Patent Application No. 2004-172452, filed on Jun. 10, 2004; the entire contents of which are incorporated herein by reference.

BACKGROUND OF THE INVENTION

1. Field of the Invention

This invention relates to a semiconductor apparatus, and more particularly is used for detecting defects such as cracks and breaks in a semiconductor chip at the time of packaging.

2. Background Art

In recent years, portable devices as typified by mobile phones have been enhanced with various capabilities such as addition of a camera, and the number of components used therefor tends to increase. However, portable devices still continue to be downsized, which increases the demand for using smaller and slimmer components. For this reason, the chip size of semiconductor apparatuses such as power amplifier modules has been reduced, and mount module boards and packages have been made smaller and slimmer. Moreover, the field of packaging techniques has seen an introduction of flip chip bump packaging, which involves smaller packaging area than in using wire bonding.

On the other hand, the above-described power amplifier generates a large amount of heat because of its operation at an extremely high power density, and thus requires close attention to its thermal stability. One of the measures to address this is to improve heat dissipation. One of the technical trends therefor is to reduce the thickness of the chip.

This involves a problem of causing cracks and breaks in a semiconductor chip due to mechanical and thermal stress at the time of packaging such as the mounting and bonding of the semiconductor chip.

Methods of detecting cracks and breaks in a semiconductor chip are disclosed in Japanese Laid-Open Patent Applications 6-244254 (1994) and 6-347509 (1994). In these known arts, as shown in FIG. 10, a conductive pattern is arranged in the chip periphery region. A chip crack will disconnect the conductive pattern. The presence of chip crack is detected by sensing the change of electric characteristics of the pattern. In FIG. 10, a strip-like conductive pattern 102 made of aluminum or silver paste is formed in the periphery region of a semiconductor chip 101 made of compound semiconductor such as a gallium arsenide (GaAs) substrate. The conductive pattern 102 generally circumscribes the semiconductor chip 101. Detecting pads 103 adjacent to each other are connected to both ends of the conductive pattern 102, and configured to detect cracks and breaks in the semiconductor chip 101 by measuring the value of current between the pads.

However, fine cracks (microcracks) may cause only a slight change of electric characteristics because the conductive pattern does not lead to disconnection or the damage to the conductive pattern is not significant. Therefore this method still has a problem that chip cracks cannot be detected reliably.

To solve this problem, a method of using p-n junction is proposed in Japanese Laid-Open Patent Application 6-77300 (1994). This method takes advantage of the fact that a microcrack crossing a p-n junction produces a path of surface current, which changes the electric characteristics of the junction. More specifically, it is suggested that chip cracks, and also microcracks, can be detected by examining leak current under a reverse bias to the p-n junction.

However, the inventor's investigation has revealed a problem that chip cracks cannot be always detected reliably by application of the above approach to a chip of compound semiconductor such as GaAs. More specifically, compound semiconductor as typified by GaAs often incurs a smooth cleavage surface by nature. For this reason, application of the above approach to a chip of compound semiconductor such as GaAs does not always lead to a large leak current. A problem is thus found that chip cracks cannot be detected reliably by examining the electric characteristics of p-n junction.

SUMMARY OF THE INVENTION

According to an aspect of the invention, there is provided a semiconductor apparatus comprising:

a semiconductor substrate having a device region and a periphery region surrounding the device region;

a semiconductor device provided in the device region of the semiconductor substrate;

a first electrode pad provided on the semiconductor substrate;

a second electrode pad provided on the semiconductor substrate;

a strip-like, first conductivity type semiconductor pattern extending in the periphery region of the semiconductor substrate, the first electrode pad being electrically connected to one end of the first conductivity type semiconductor pattern; and a strip-like, second conductivity type semiconductor pattern provided on the first conductivity type semiconductor pattern and constituting a p-n junction in conjunction with the first conductivity type semiconductor pattern, the first and second electrode pads being electrically connected to both ends of the second conductivity type semiconductor pattern.

According to other aspect of the invention, there is provided a semiconductor apparatus comprising:

a semiconductor substrate having a device region and a periphery region surrounding the device region;

a semiconductor device provided in the device region of the semiconductor substrate;

a first electrode pad provided on the semiconductor substrate;

a second electrode pad provided on the semiconductor substrate;

a third electrode pad provided on the semiconductor substrate;

a strip-like, first conductivity type semiconductor pattern extending in the periphery region of the semiconductor substrate and electrically connected to the first electrode pad;

a strip-like, second conductivity type semiconductor pattern provided on the first conductivity type semiconductor pattern and constituting a p-n junction in conjunction with the first conductivity type semiconductor pattern, the second electrode pad being electrically connected to one end of the second conductivity type semiconductor pattern; and a first conductivity type semiconductor layer electrically connected to the third electrode pad and provided on the other end of the second conductivity type semiconductor pattern to constitute at least in part a p-n junction, thereby constituting a transistor in conjunction with the first and second conductivity type semiconductor patterns.

According to other aspect of the invention, there is provided a method of detecting defects in a semiconductor apparatus including:

a semiconductor substrate having a device region and a periphery region surrounding the device region;

a semiconductor device provided in the device region of the semiconductor substrate;

a first electrode pad provided on the semiconductor substrate;

a second electrode pad provided on the semiconductor substrate;

a strip-like, first conductivity type semiconductor pattern extending in the periphery region of the semiconductor substrate, the first electrode pad being electrically connected to one end of the first conductivity type semiconductor pattern; and a strip-like, second conductivity type semiconductor pattern provided on the first conductivity type semiconductor pattern and constituting a p-n junction in conjunction with the first conductivity type semiconductor pattern, the first and second electrode pads being electrically connected to both ends of the second conductivity type semiconductor pattern, the method comprising:

detecting cracks or breaks in the semiconductor apparatus by applying voltage between the first and second electrode pads to sense current flowing between the first and second electrode pads.

According to other aspect of the invention, there is provided a method of detecting defects in a semiconductor apparatus including:

a semiconductor substrate having a device region and a periphery region surrounding the device region;

a semiconductor device provided in the device region of the semiconductor substrate;

a first electrode pad provided on the semiconductor substrate;

a second electrode pad provided on the semiconductor substrate;

a third electrode pad provided on the semiconductor substrate;

a strip-like, first conductivity type semiconductor pattern extending in the periphery region of the semiconductor substrate and electrically connected to the first electrode pad;

a strip-like, second conductivity type semiconductor pattern provided on the first conductivity type semiconductor pattern and constituting a p-n junction in conjunction with the first conductivity type semiconductor pattern, the second electrode pad being electrically connected to one end of the second conductivity type semiconductor pattern; and a first conductivity type semiconductor layer electrically connected to the third electrode pad and provided on the other end of the second conductivity type semiconductor pattern to constitute at least in part a p-n junction, thereby constituting a transistor in conjunction with the first and second conductivity type semiconductor patterns, the method comprising:

detecting cracks or breaks in the semiconductor apparatus by applying voltage between the second and third electrode pads while applying voltage between the first and third electrode pads to sense current flowing between the first and third electrode pads.

DETAILED DESCRIPTION OF THE INVENTION

In an embodiment of the invention, a strip-like pattern of p-n junction is formed in the periphery region of a semiconductor chip to surround the device region at the center of the chip. A pattern of one conductivity type is formed in a circular configuration and has two pads electrically connected to both ends of the pattern of the one conductivity type. A pattern of the other conductivity type is configured to have one end electrically connected to one of the two pads. Cracks and breaks in the semiconductor chip can be detected with excellent sensitivity by measuring the electric characteristics between the two pads.

In the following, the embodiment for carrying out the invention will be described with reference to examples.

EXAMPLES

First Example

The first example will be described with reference to FIGS. 1 to 4.

Figure 1:
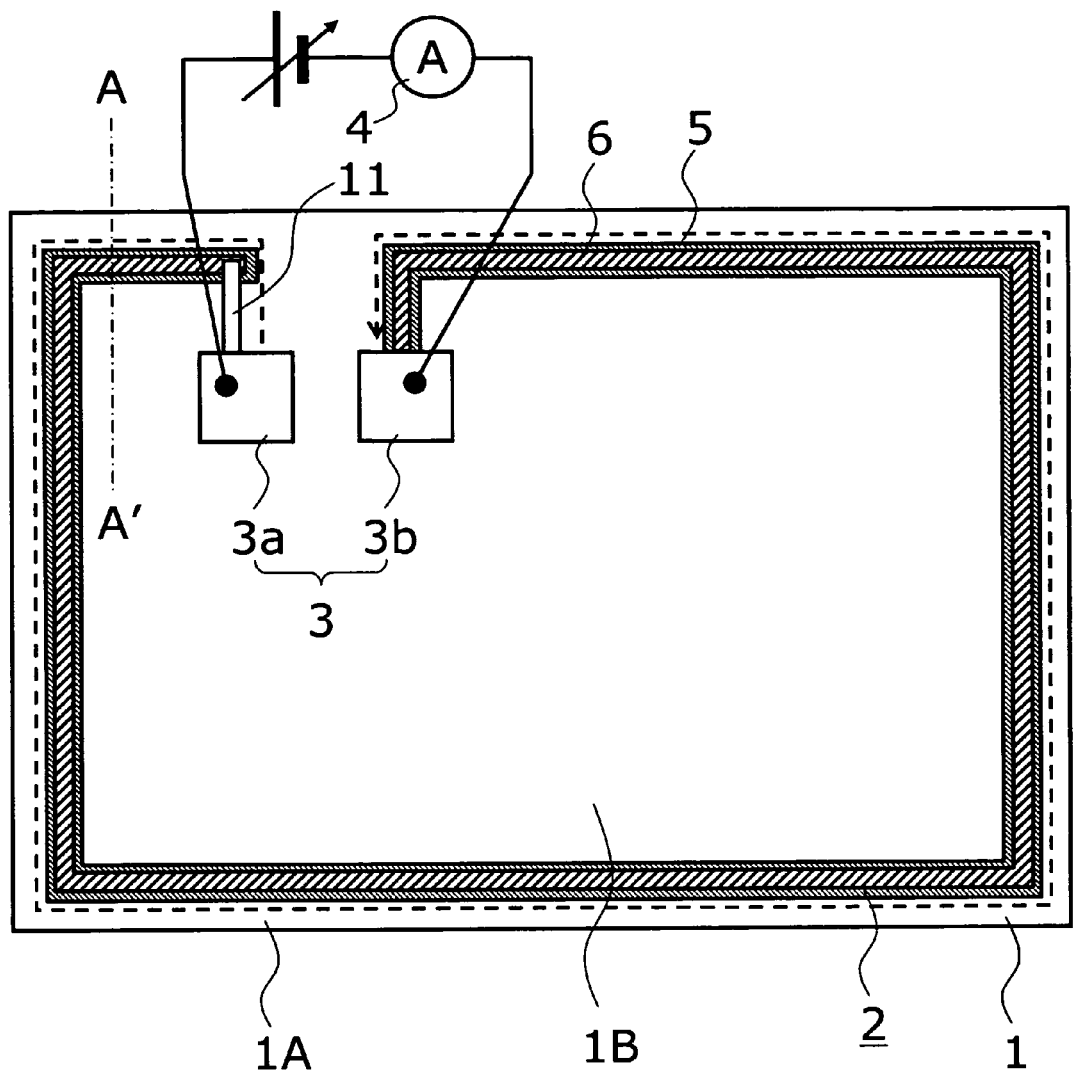
FIG. 1 is a schematic plan view of a semiconductor apparatus according to a first example of the invention.
Figure 2:
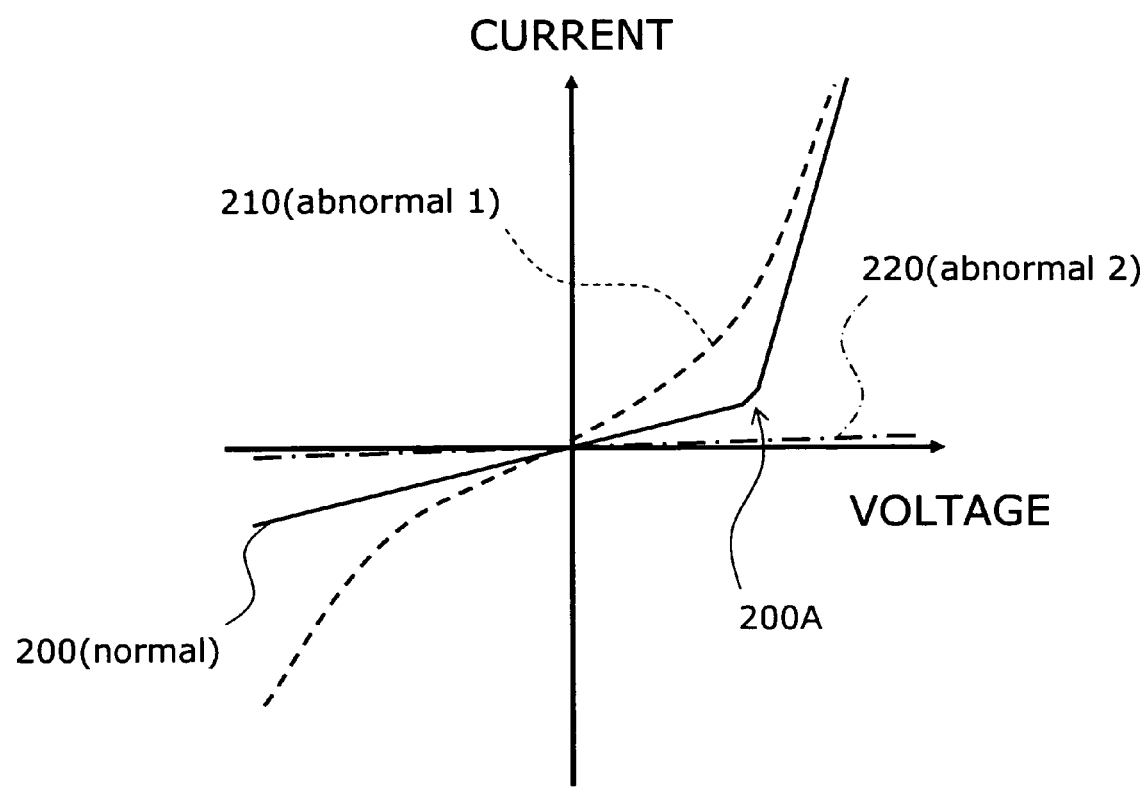
FIG. 2 is a graph of current-voltage characteristics of the first example of the invention.

FIG. 1 is a plan view of a semiconductor chip according to the first example of the invention. FIG. 2 is a graph showing current-voltage characteristics of a semiconductor chip according to the first example of the invention. FIGS. 3A to 3D are equivalent circuit diagrams of a detection circuit according to the first example of the invention. FIG. 4 is a cross-sectional view of the part along line A-A' in FIG. 1.

The semiconductor chip 1 is made of compound semiconductor such as a semi-insulating gallium arsenide (GaAs) substrate. The semiconductor chip 1 has, for example, a power amplifier or other device (not shown) formed on a device region 1B except a periphery region 1A. This figure shows the chip in which device formation and formation of internal interconnect (not shown) are completed. Detecting pads 3 (3a, 3b) are arranged on the semiconductor chip 1. The detecting pads 3 are connection electrodes that are made of aluminum, gold, platinum, or titanium, or laminated film thereof, and that are electrically connected to the device or internal interconnect. Strip-like semiconductor patterns 5, 6 are formed from conductive semiconductor layers in the periphery region 1A of the semiconductor chip 1 to surround the device region of the semiconductor chip 1. Semiconductor patterns 5, 6 have a two-layer structure. The lower layer is an n-type semiconductor layer (n-type semiconductor pattern) 5, on which a p-type semiconductor layer (p-type semiconductor pattern) 6 is formed, and the two layers constitute a p-n junction 2. The n-type semiconductor pattern 5 is formed in the periphery region of the semiconductor chip 1 to surround the device region, and is ohmically connected to the pad 3b at one end. The p-type semiconductor pattern 6 is ohmically connected to the pads 3a and 3b at both ends. The wiring layer 11 is appropriately provided between the semiconductor layer and the pads.

More specifically, an $n^+$-type semiconductor layer 9 is formed on the semi-insulating GaAs substrate. On the $n^+$-type semiconductor layer 9, a conductive layer having an impurity concentration of $5\times10^{18}/cm^3$ and a thickness of 500 nm, for example, is formed as the n-type semiconductor layer 5, on which a conductive layer having an impurity concentration of $4\times10^{19}/cm^3$ and a thickness of 60 nm, for example, is formed as the p-type semiconductor layer 6. The $n^+$-type semiconductor layer 9 and n-type semiconductor layer 5 are patterned by increasing resistance around them using boron ($B^+$) ion implantation, and processed into a circular pattern having a width of 50 μm. The p-type semiconductor layer 6 is patterned by etching and processed into a strip-like pattern having a width of 40 μm on the n-type semiconductor layer 5.

FIG. 2 shows the electric characteristics between the two pads 3a and 3b in this situation. FIGS. 3A to 3D are the associated equivalent circuit diagrams.

Without chip cracks, the two pads 3a and 3b are interconnected via the p-type semiconductor pattern 6. Therefore, current flows through a path P1 shown in FIG. 3B. When the voltage between the pads is increased to a value ($V_F$) at which the p-n junction 2 is turned on, current flows also in the n-type semiconductor pattern 5 through a path P2. Therefore, in normal condition, the current-voltage characteristics (I-V characteristics) 200 as shown in FIG. 2 is observed. The discontinuity 200A in the I-V characteristics is a point at which the p-n junction is turned on and current begins to flow through the path P2.

In order to make the discontinuity 200A more distinct, the sheet resistance of the n-type semiconductor pattern 5 is preferably selected to have a smaller value than that of the p-type semiconductor pattern 6. To this end, as shown in FIG. 4, for example, the n-type semiconductor pattern 5 may have a larger width and/or thickness than that of the p-type semiconductor pattern 6.

Next, the case where a chip crack occurs is described.

Figure 3A:
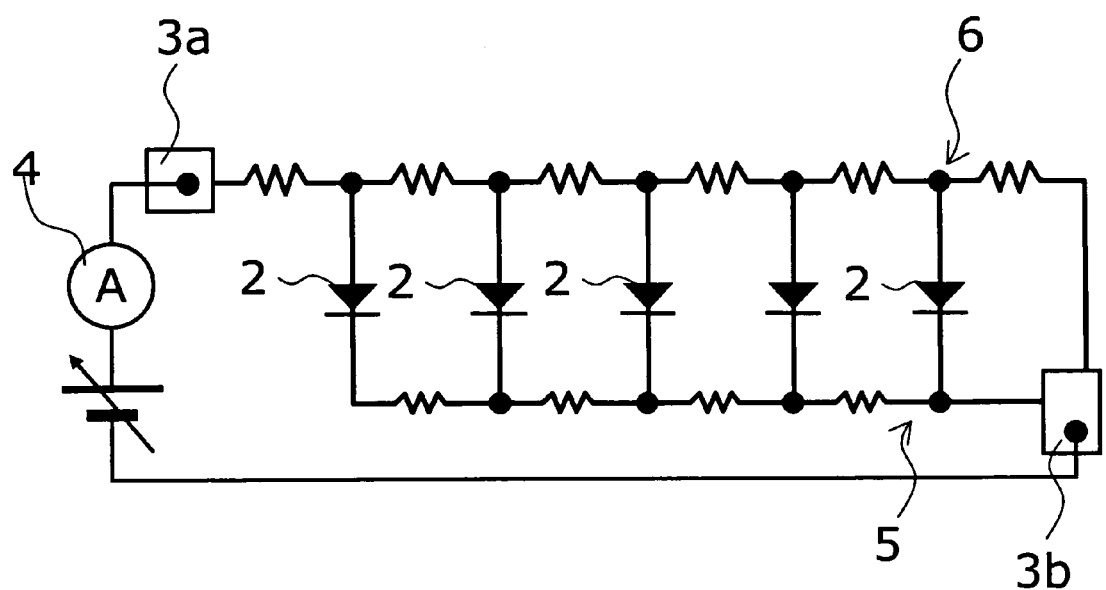
FIGS. 3A to 3D are equivalent circuit diagrams of a detection circuit in the first example of the invention.
Figure 3B:
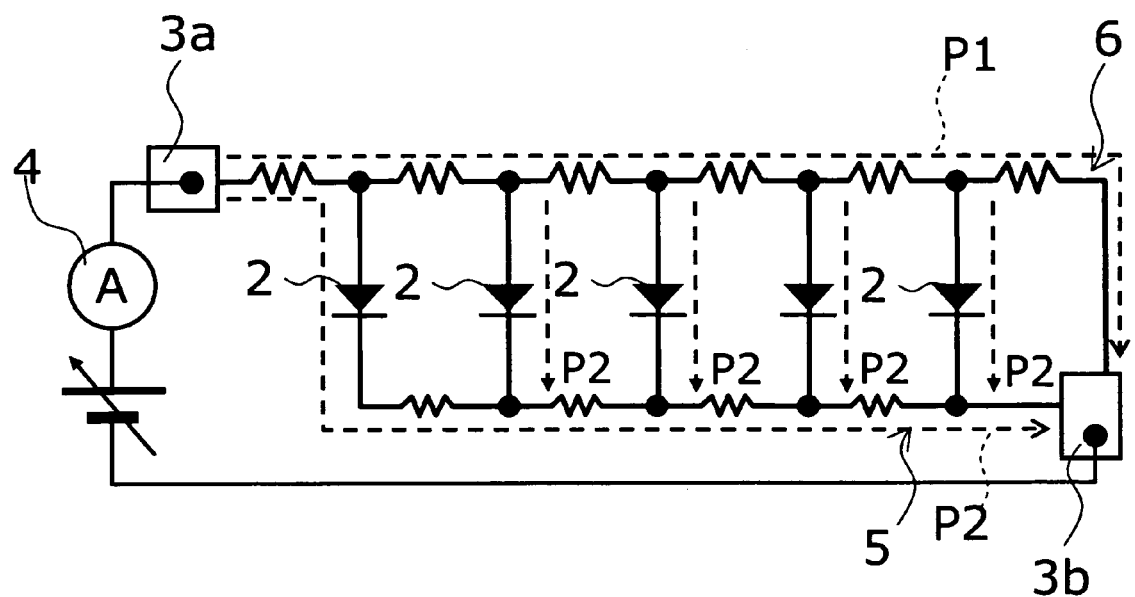
Figure 3C:
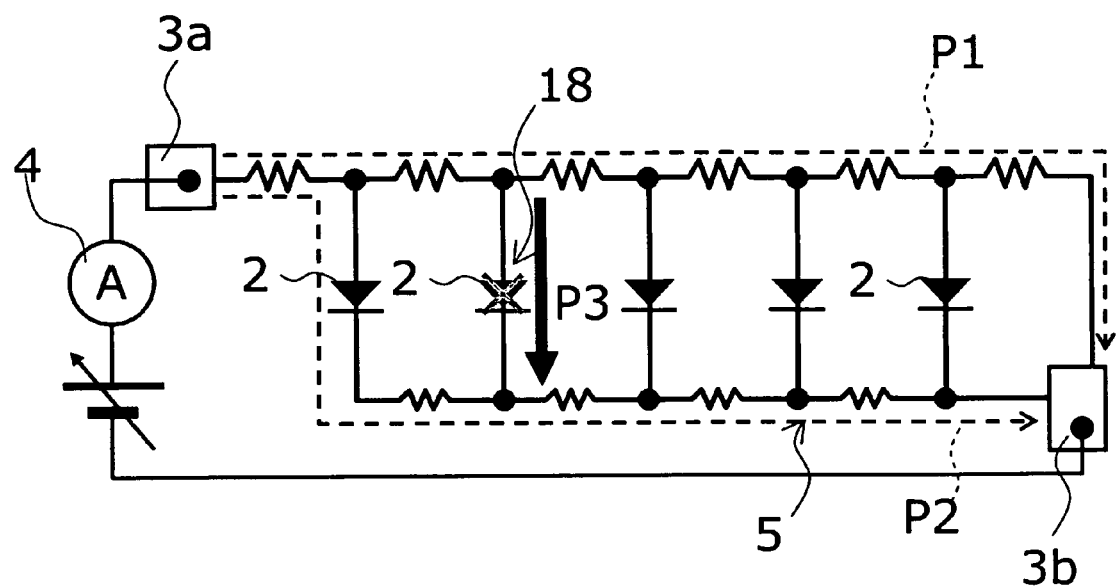
Figure 3D:
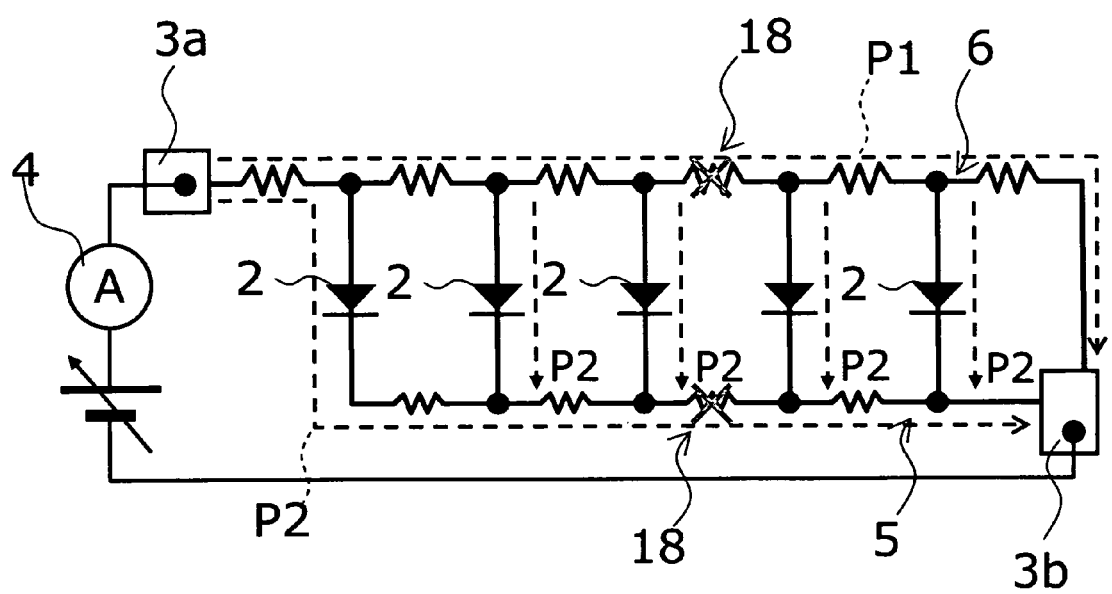
Figure 4:
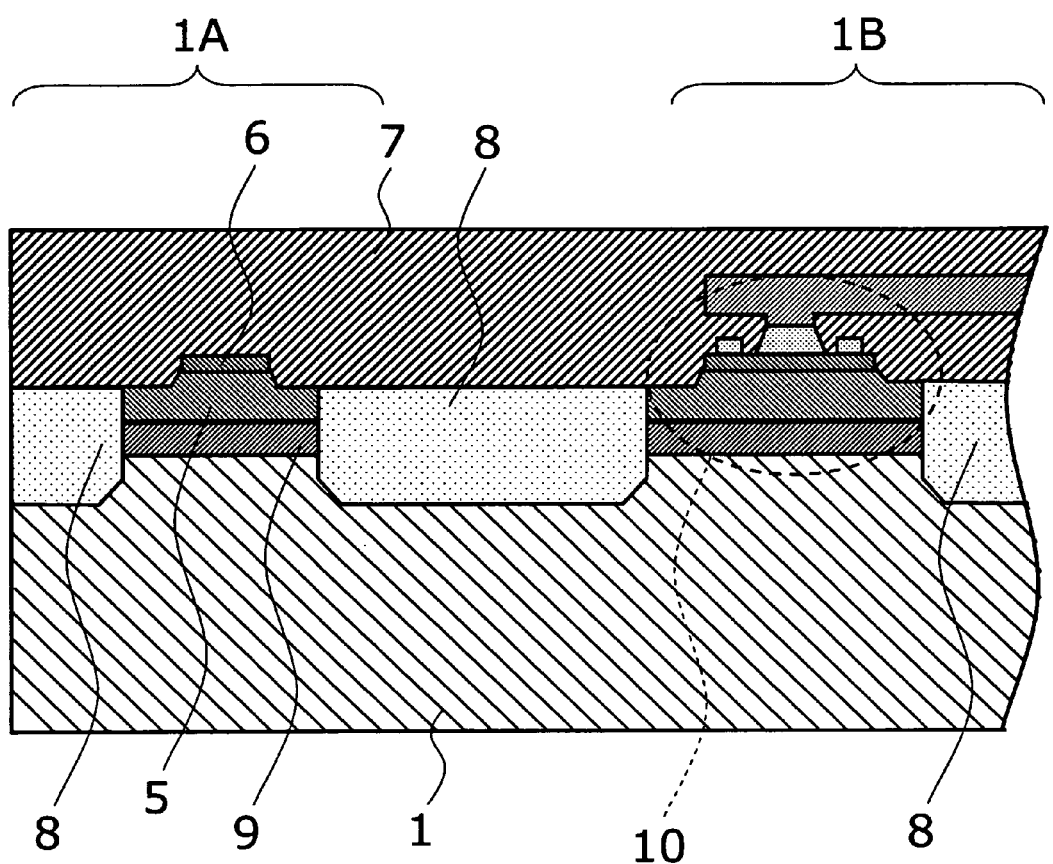
FIG. 4 is a cross-sectional view of the part along line A-A' in FIG. 1.

As shown in FIG. 3C, when a chip crack 18 destroys a p-n junction 2 to allow leak current P3 to flow across the p-n junction, increase of current value under a voltage below the turn-on voltage is observed in the I-V characteristics using an ammeter 4 as shown by current-voltage characteristics 210 in FIG. 2 (abnormal 1). The chip crack can thus be detected by observing the increase of current.

However, a GaAs substrate is typically easy to incur a smooth cleavage. For this reason, in the case of a chip crack involving a cleavage surface, leak current at the p-n junction can be scarcely detected. Therefore this method may fail to detect the chip crack because the current-voltage characteristics 210 shown in FIG. 2 are not observed.

However, in this case, the chip crack damages the n-type semiconductor pattern 5 and p-type semiconductor pattern 6 per se. Therefore decrease of current value is observed as shown by current-voltage characteristics 220 in FIG. 2 (abnormal 2), which allows the chip crack to be detected.

FIG. 4 is a cross-sectional view showing the internal structure of the semiconductor chip. The n-type semiconductor layer 5 and p-type semiconductor layer 6 are formed on the $n^+$-type semiconductor layer 9 to form a p-n junction in the periphery region of the semiconductor chip 1 made of a GaAs substrate in which a device separation region 8 is formed. The process of forming this p-n junction is also used for simultaneously forming a p-n junction constituting the circuit in the device region. Another n-type semiconductor layer is stacked thereon to form an npn transistor 10. The transistor 10 is provided with an interconnect layer, and a protection insulating film 7 made of polyimide and the like.

As described above, the structure of this example can be used to detect chip cracks with high sensitivity by sensing leak current at a p-n junction for a fine chip crack and by sensing the variation of resistor value for a large and clean chip crack that shows a cleavage surface.

In addition, the p-n junction formed in this example is formed in conjunction with the p-n junction in the device region. Therefore there is no increase of manufacturing steps.

FIGS. 5A to 5D are process cross-sectional views showing part of a process of manufacturing a semiconductor apparatus of this example.

Figure 5A:
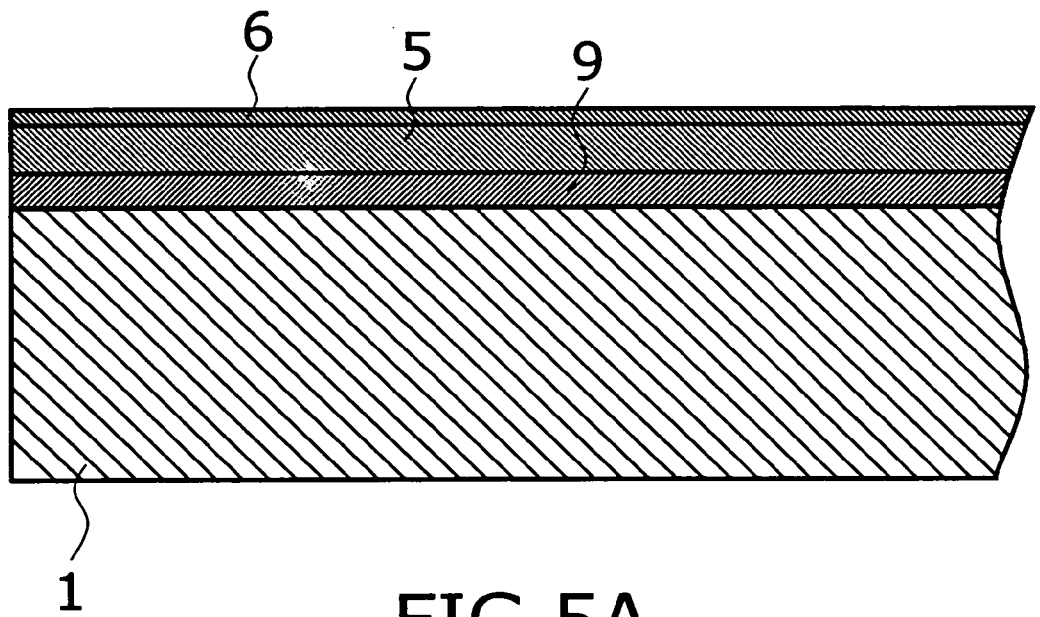
FIGS. 5A to 5D are process cross-sectional views showing part of a process of manufacturing a semiconductor apparatus of this example.

More specifically, as shown in FIG. 5A, an $n^+$-type semiconductor layer 9, n-type semiconductor layer 5, and p-type semiconductor layer 6 are stacked in this order on a semi-insulating GaAs substrate 1.

Figure 5B:
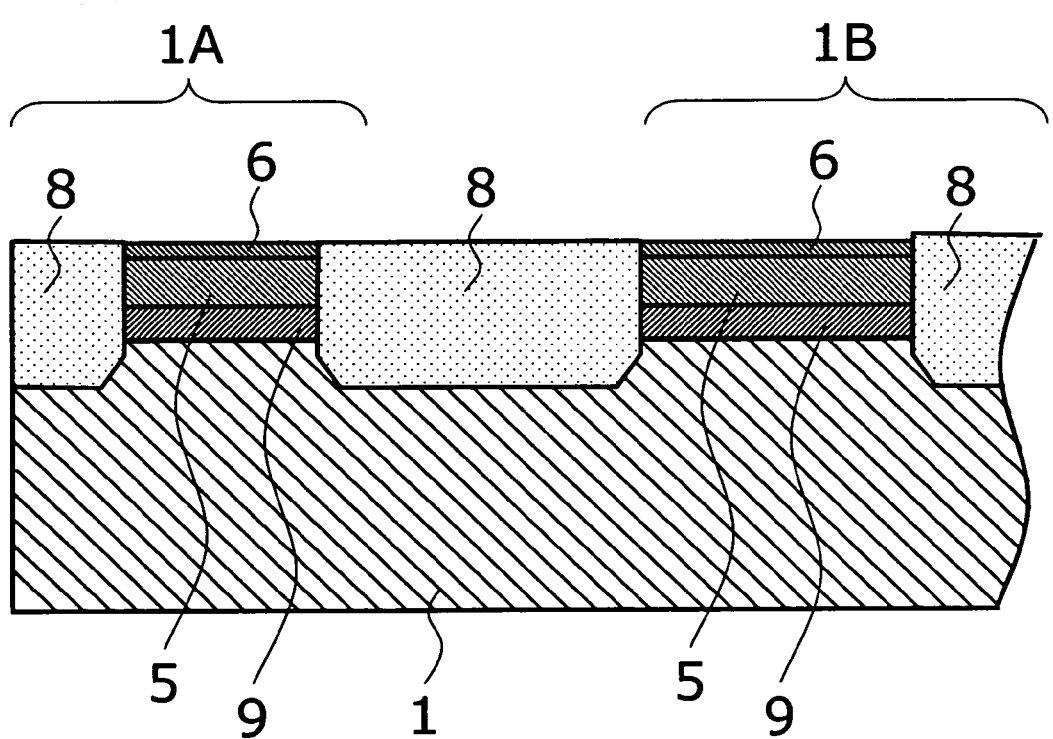

Next, as shown in FIG. 5B, a device separation region 8 having high resistance is formed using boron ($B^+$) ion implantation to pattern the semiconductor layers 9, 5, and 6 in the periphery region 1A and device region 1B, respectively.

Figure 5C:
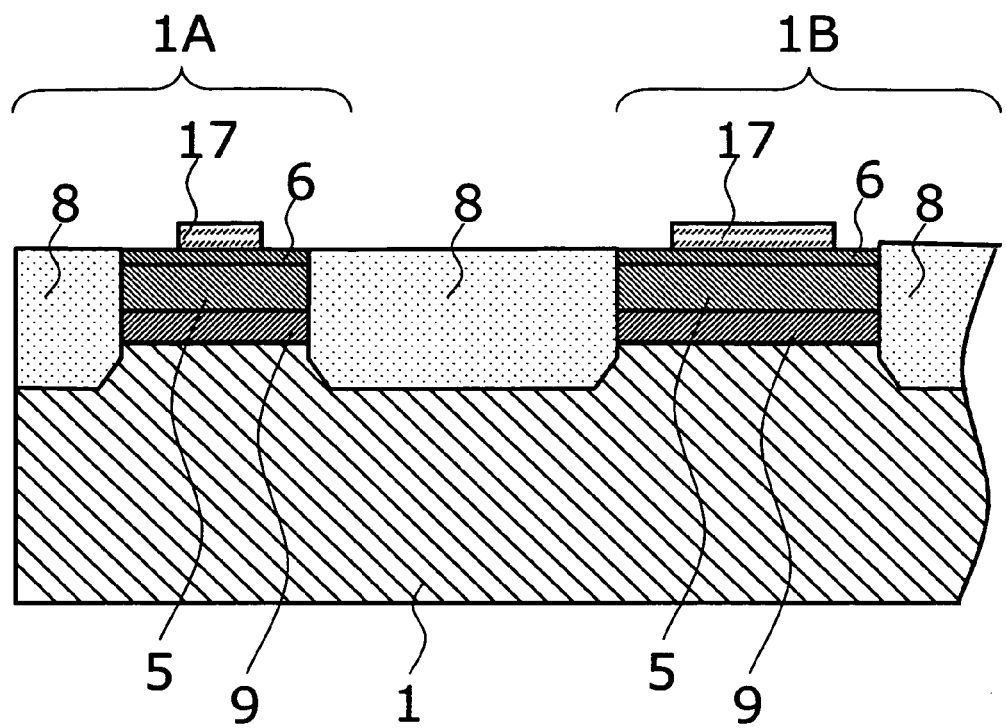

Next, as shown in FIG. 5C, an etching mask 17 is formed.

Figure 5D:
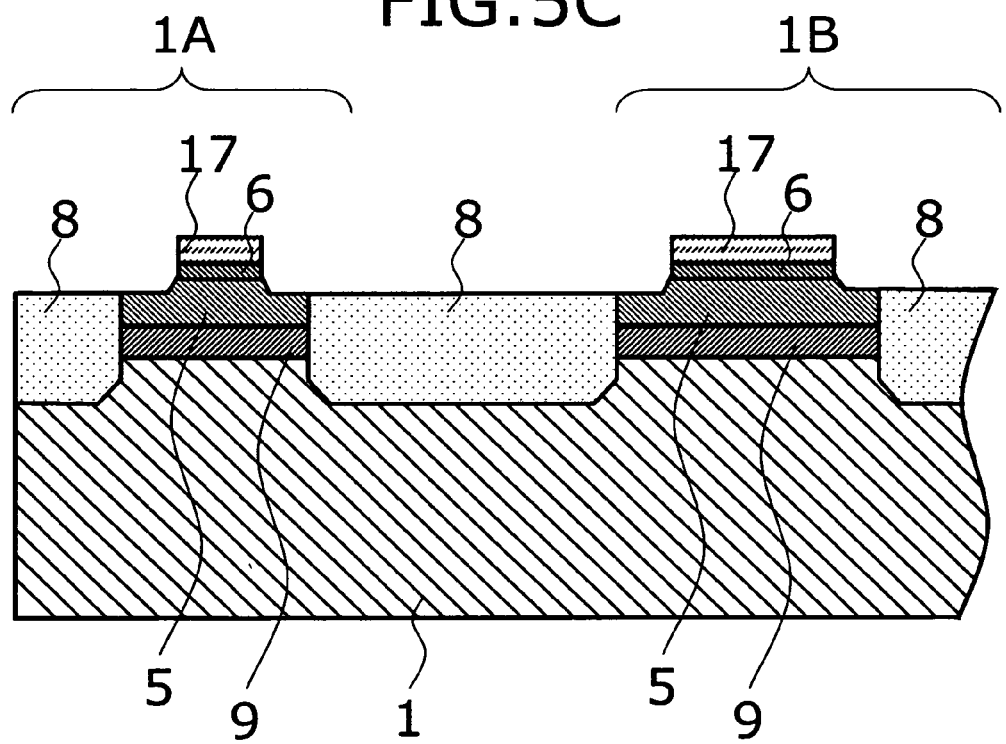

Next, as shown in FIG. 5D, part of the p-type semiconductor layer 6 and n-type semiconductor layer 5, respectively, are etched to carry out the patterning of the p-type semiconductor layer 6.

Subsequently, the etching mask 17 is removed, and insulating film and interconnect structure are formed thereon to complete a semiconductor apparatus as shown in FIG. 4.

As described above, according to this example, the p-n junctions in the periphery region 1A and in the device region 1B can be formed simultaneously. Therefore there is no increase of manufacturing steps for forming the structure in the periphery region 1A.

Second Example

Next, the second example will be described with reference to FIGS. 6 to 9.

Figure 6:
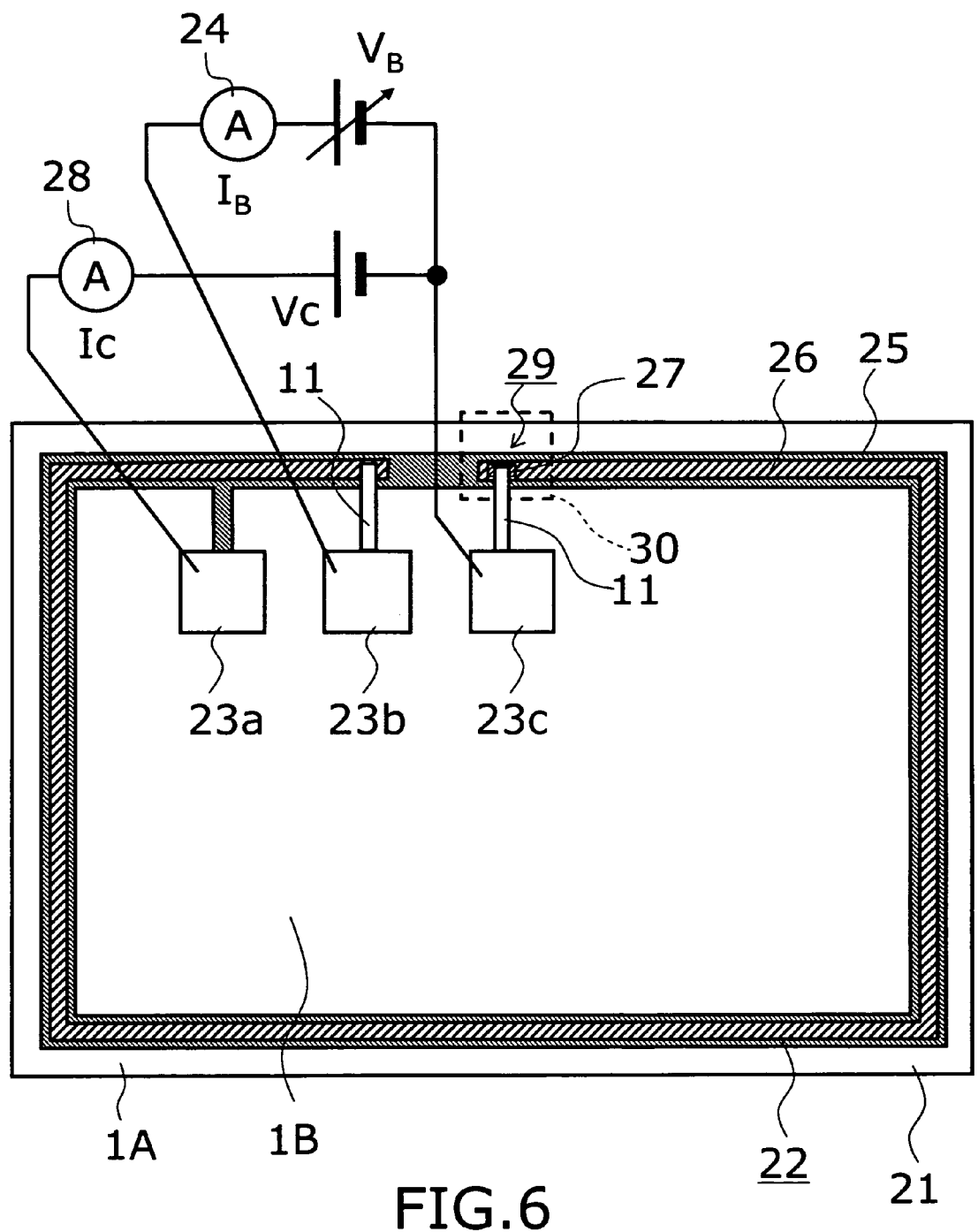
FIG. 6 is a schematic plan view of a semiconductor apparatus according to a second example of the invention.
Figure 7:
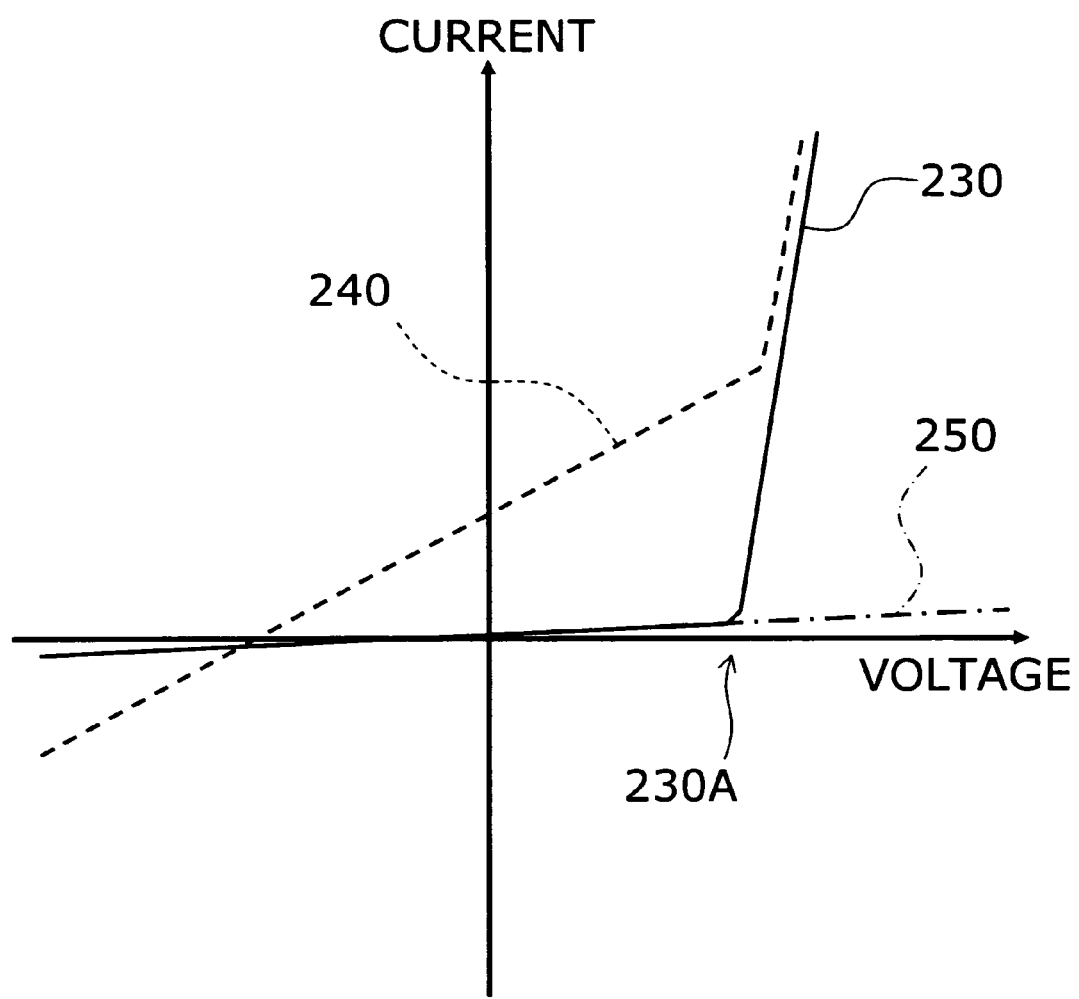
FIG. 7 is a graph of current-voltage characteristics of the second example of the invention.
Figure 8A:
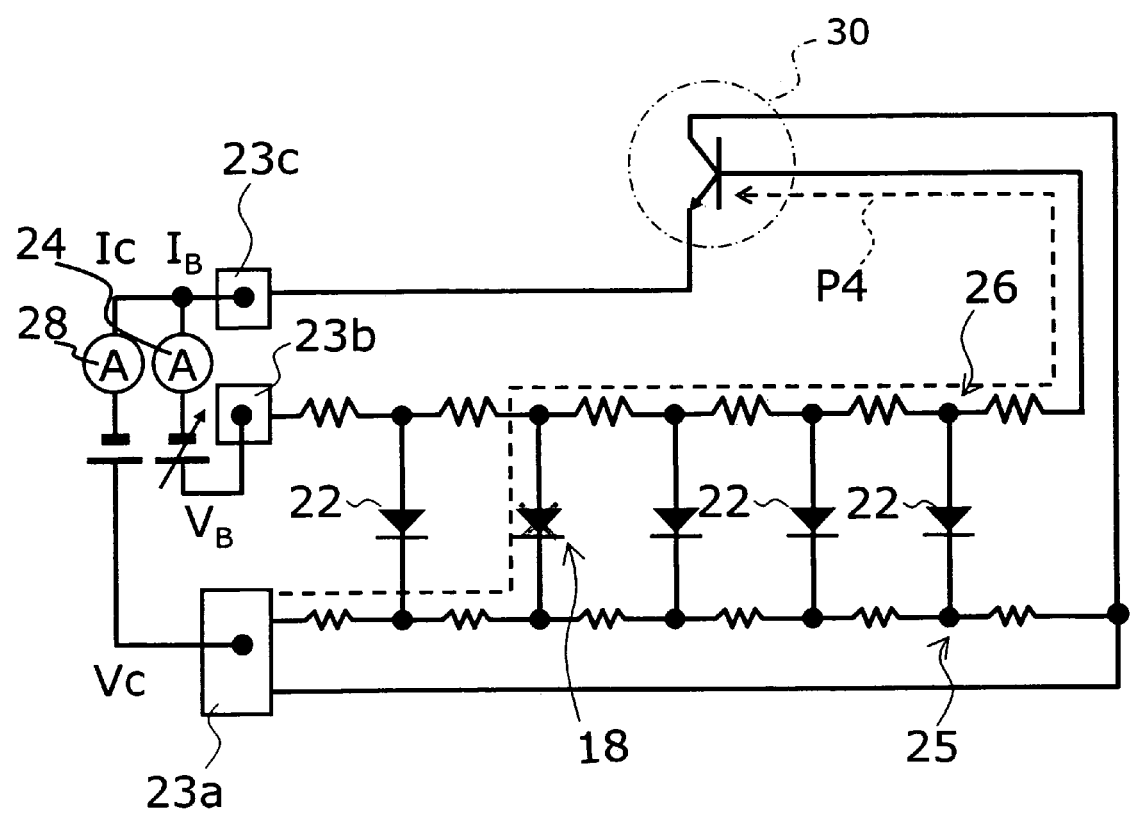
FIGS. 8A and 8B are equivalent circuit diagrams of a detection circuit in the second example of the invention.
Figure 8B:
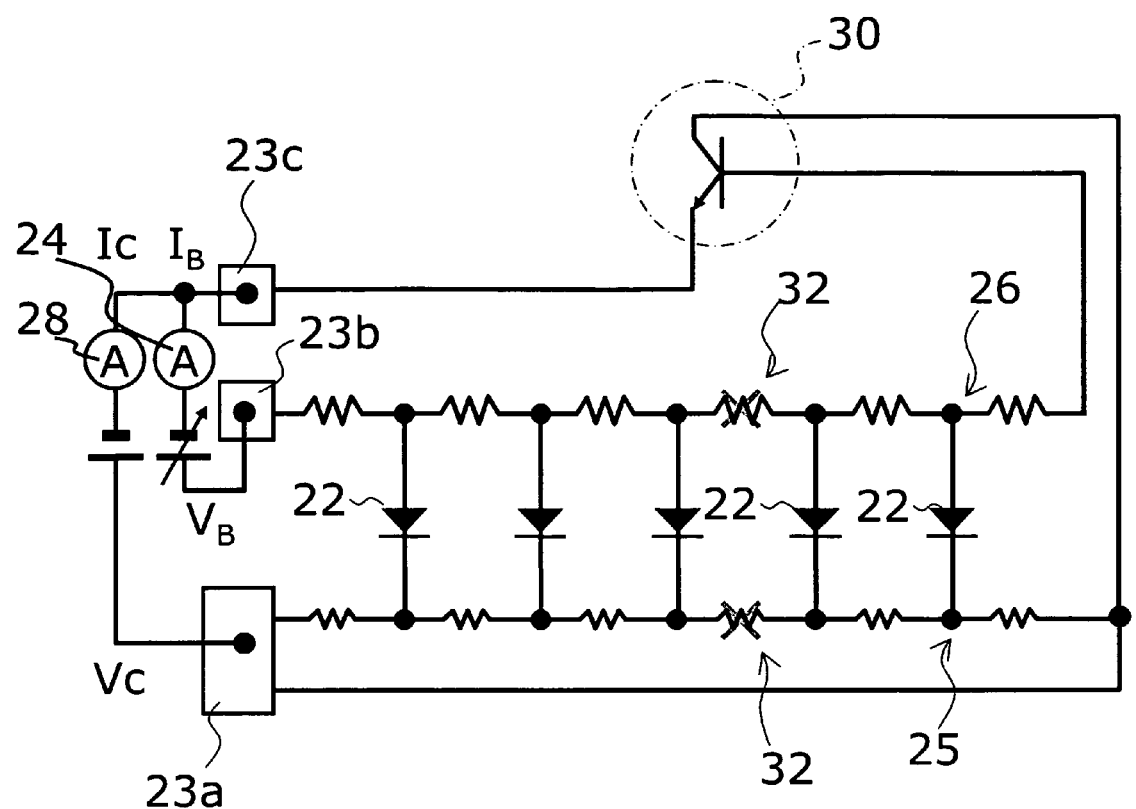
Figure 9:
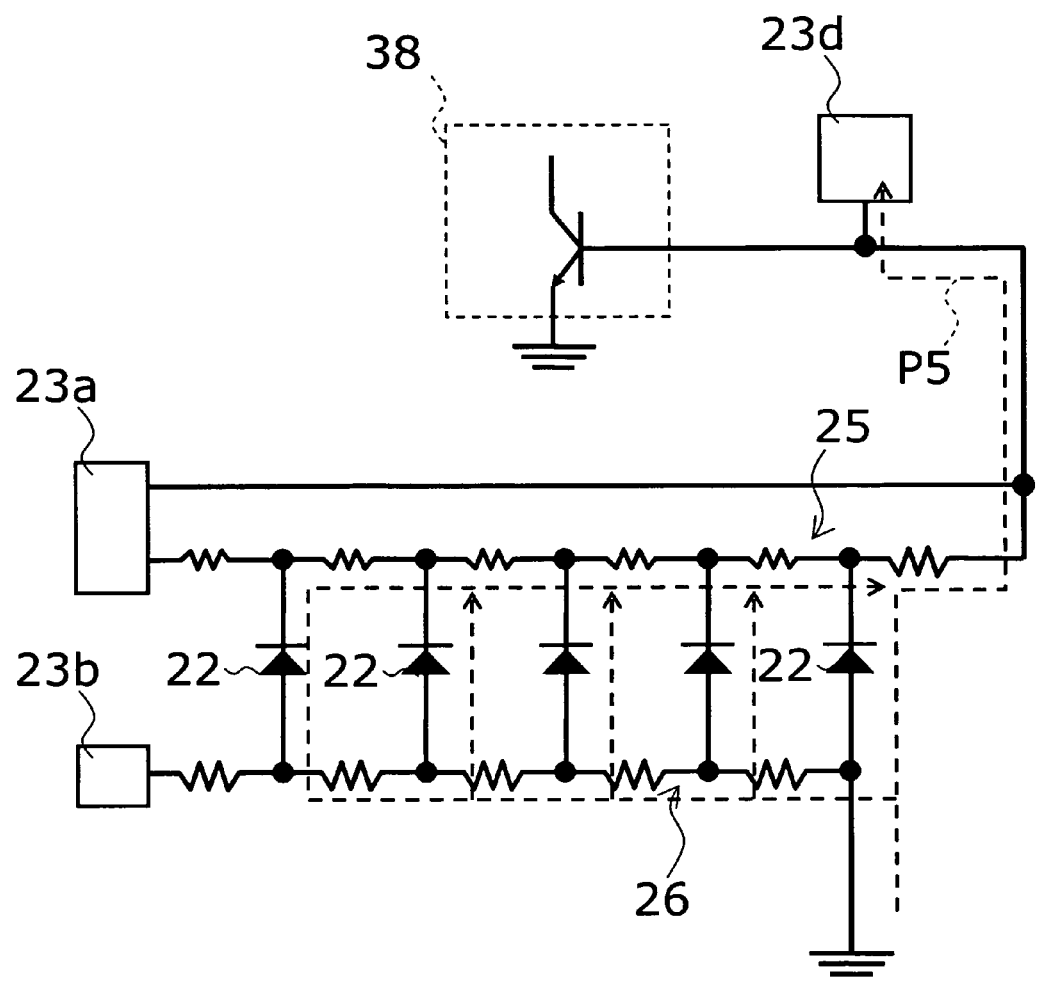
FIG. 9 is a circuit diagram illustrating a surge protection circuit function of the second example.
Figure 10:
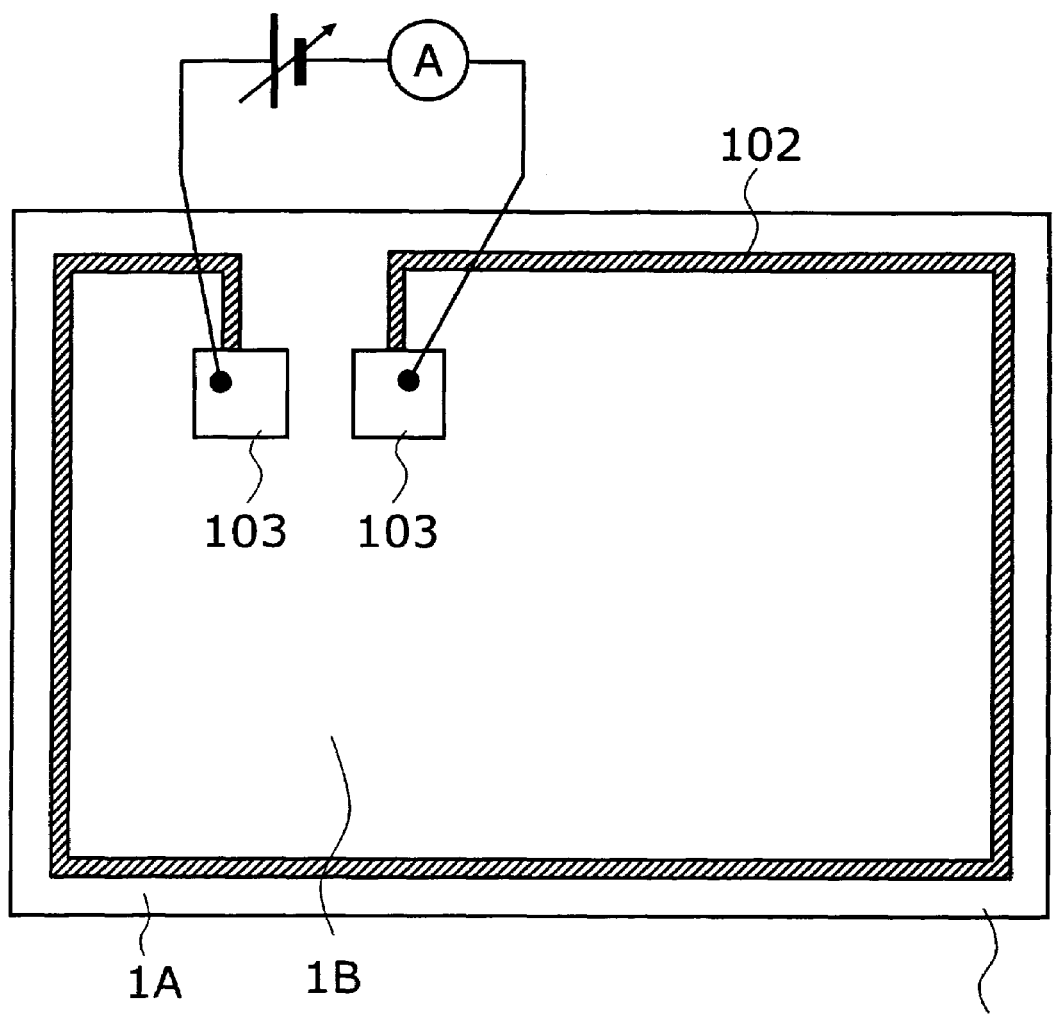
FIG. 10 is a schematic plan view of a semiconductor apparatus provided with conventional chip crack detection.

FIG. 6 is a plan view of a semiconductor chip according to the second example of the invention. FIG. 7 is a graph showing current-voltage characteristics of a semiconductor chip according to the second example of the invention. FIGS. 8A and 8B are equivalent circuit diagrams of a detection circuit according to the second example of the invention. FIG. 9 is a circuit diagram illustrating a surge protection circuit function of the second example.

As with the first example, the semiconductor chip 21 made of compound semiconductor such as a semi-insulating gallium arsenide (GaAs) substrate is shown in which formation of, for example, a power amplifier or other device and of internal interconnect (not shown) are completed.

Detecting pads 23 (23a, 23b, 23c) are arranged on the semiconductor chip 21. The detecting pads 23 are connection electrodes that are made of aluminum, gold, platinum, or titanium, or laminated film thereof, and that are electrically connected to the device or internal interconnect. Strip-like semiconductor patterns 25, 26 are formed from conductive semiconductor layers in the periphery region of the semiconductor chip 21 to surround the device region of the semiconductor chip 21. The semiconductor patterns 25, 26 have a two-layer structure. As with that described above with reference to FIG. 4, the lower layer is an n-type semiconductor layer (n-type semiconductor pattern) 25, on which a p-type semiconductor layer (p-type semiconductor pattern) 26 is formed, and the two layers constitute a p-n junction 22. The n-type semiconductor pattern 25 is formed in the periphery region of the semiconductor chip 21 as a loop surrounding the device region, and is ohmically connected to the pad 23a at one end. The p-type semiconductor pattern 26 is ohmically connected to the pad 23b at one end.

In this example, a third pad 23c is further provided. Part of an n-type semiconductor layer (n-type semiconductor pattern) 27 is stacked on the p-type semiconductor pattern 26, and the contacting portion between them constitutes a p-n junction 29. The pad 23c is ohmically connected to the n-type semiconductor pattern 27. The n-type semiconductor pattern 25, p-type semiconductor pattern 26, and n-type semiconductor layer (n-type semiconductor pattern) 27 constitute an npn transistor 30 in their stacked portion.

It is understood that the stacking order of the n-type semiconductor pattern 25, p-type semiconductor pattern 26, and n-type semiconductor pattern 27 may be reversed. That is, the p-type semiconductor pattern 26 may be stacked on the n-type semiconductor pattern 27, and the n-type semiconductor pattern 25 may be further stacked on the p-type semiconductor pattern 26.

More specifically, on the semi-insulating GaAs substrate, a conductive layer having an impurity concentration of $5 \times 10^{18}/cm^3$ and a thickness of 500 nm, for example, is formed as the n-type semiconductor pattern 25, on which a conductive layer having an impurity concentration of $4 \times 10^{19}/cm^3$ and a thickness of 60 nm, for example, is formed as the p-type semiconductor pattern 26. The n-type semiconductor layer 27 stacked on the p-type semiconductor pattern 26 is formed in the condition of an impurity concentration of $5 \times 10^{17}/cm^3$ and a thickness of 300 nm, for example. The n-type semiconductor layer 25 is patterned by eliminating its conductivity using boron ($B^+$) ion implantation, and processed into a circular pattern having a width of 50 µm. The p-type semiconductor pattern 26 is patterned by etching and processed into a strip-like pattern having a width of 40 µm on the n-type semiconductor pattern 25. The n-type semiconductor layer 27 on the p-type semiconductor pattern 26 is patterned by etching and the portion connected to the n-type semiconductor pattern is processed into an island shape having a width and length of 30 µm. The n-type semiconductor pattern 27 is electrically connected to the third pad 23c by internal connect 11.

FIG. 7 is a graph illustrating the current flowing between the pads 23a and 23c versus the voltage applied to the pad 23b. That is, the horizontal axis of this figure indicates the voltage applied to the pad 23b, and the vertical axis indicates the current flowing between the pads 23a and 23c.

A voltage of 3 V, for example, is applied to the pad 23a connected to the underlying n-type semiconductor pattern 25, and the pad 23c connected to the overlying n-type semiconductor layer 27 is set to ground (0 V). In this condition, the voltage applied to the pad 23b connected to the p-type semiconductor pattern 26 is gradually increased. In normal condition, that is, when there is no chip crack, base current of the npn transistor begins to flow at a voltage near the turn-on voltage 230A of the p-n junction. This causes current to flow between the pads 23a and 23c, which is sensed by an ammeter 28 to obtain current-voltage characteristics 230 shown in FIG. 7 (normal).

In this case again, in order to make the turn-on voltage 230A more distinct, the sheet resistance of the n-type semiconductor pattern 25 is preferably selected to have a smaller value than the that of the p-type semiconductor pattern 26. To this end, as described above with reference to FIG. 4, for example, the n-type semiconductor pattern 25 may have a larger width and/or thickness than that of the p-type semiconductor pattern 26.

On the other hand, when a chip crack destroys a p-n junction to result in a situation where leak current flows across the pn junction (see the equivalent circuit diagram in FIG. 8A), leak current P4 occurs between the pads 23a and 23b. As a result, base current P4 flows through the npn transistor without application of voltage to the pad 23b. Therefore, increase of current value under a voltage below the turn-on voltage is observed in the I-V characteristics as shown by current-voltage characteristics 240 in FIG. 7 (abnormal 1), which allows the chip crack to be detected. However, in the case of a clean chip crack showing a cleavage surface, leak current can be scarcely detected. Therefore the current-voltage characteristics 240 is not observed.

However, the chip crack damages the p-type semiconductor pattern 26 per se. Therefore the current path is blocked as shown in FIG. 8B. As a result, base current does not flow even in the voltage region above the turn-on voltage as shown by characteristics 250 in FIG. 7 (not detected by the ammeter 24 (abnormal 2)), which allows the chip crack to be detected.

As described above, according to the method of this example, distinction in the I-V characteristics between normal and abnormal conditions is clearer than in the first example, which allows detection of chip cracks with higher sensitivity.

In addition, since the pads are interconnected through p-n junctions, they are in an open circuit condition in terms of direct current when the applied voltage is below the turn-on voltage of p-n junction. For example, the operation of the circuit is not affected if the pad 23b is connected to the ground terminal in an actual circuit rather than to the p-type semiconductor pattern 26 and the other pads 23a and 23c are connected to terminals subjected to voltages above 0 V, for example, to a control terminal or RF terminal. Therefore no additional pad is needed for a detection circuit as in the first example, and thereby the chip can be downsized. Moreover, chip cracks can be detected by using the terminals of a packaged circuit, which serves to downsize the package.

Furthermore, since a large p-n junction 22 is formed between the pads 23a and 23b, it can also serve as a surge protection circuit. That is, advantageously, this example has another function in addition to merely serving as a chip crack detection circuit.

FIG. 9 is a circuit diagram illustrating the surge protection circuit function of this example. Current P5 does not flow into the protected circuit 38 formed in the device region even when ESD of negative voltage is applied to the pads 23a, 23b, and 23d. Therefore the protected circuit 38 is not destroyed.

As described above, according to the invention, a strip-like pattern of p-n junction is formed in the periphery region of a semiconductor chip to surround the device region. A pattern of one conductivity type is formed in a circular configuration and has pads electrically connected to the pattern. A pattern of the other conductivity type is configured to have one end electrically connected to one of the pads, and the other end electrically connected to another pad. As a result, the invention can provide a semiconductor apparatus characterized in that cracks and breaks in the semiconductor chip can be detected with excellent sensitivity.

It is understood that the conductive semiconductor layer in the above examples may be a conductive semiconductor layer of a semiconductor substrate formed for use in HBT (Heterojunction Bipolar Transistor) or HEMT (High Electron Mobility Transistor), or may be a conductive semiconductor layer formed by ion implantation or annealing.

While boron ion implantation is used for patterning n-type semiconductor, device separation by mesa etching may also be used. In addition, while GaAs is used for the semiconductor substrate, any substrate of compound semiconductor made of group III and group V elements in the periodic table such as InP can also be used in the invention because such a substrate has the same cleavage property and achieves similar effects.

The invention claimed is:

1. A semiconductor apparatus comprising:
   a semiconductor substrate having a device region and a periphery region surrounding the device region;
   a semiconductor device provided in the device region of the semiconductor substrate;
   a first electrode pad provided on the semiconductor substrate;
   a second electrode pad provided on the semiconductor substrate;
   a strip-like, first conductivity type semiconductor pattern extending in the periphery region of the semiconductor substrate, the first electrode pad being electrically connected to one end of the first conductivity type semiconductor pattern; and
   a strip-like, second conductivity type semiconductor pattern provided on the first conductivity type semiconductor pattern and constituting a p-n junction in conjunction with the first conductivity type semiconductor pattern, the first electrode pad being directly connected to one end of the second conductivity type semiconductor pattern, and the second electrode pad being directly connected to another end of the second conductivity type semiconductor pattern.

2. A semiconductor apparatus according to claim 1, wherein the p-n junction formed between the first and second electrode pads has a surge protection circuit function.

3. A semiconductor apparatus according to claim 2, wherein the second conductivity type semiconductor pattern is connected to ground potential.

4. A semiconductor apparatus according to claim 1, wherein the first conductivity type semiconductor pattern has a smaller sheet resistance than that of the second conductivity type semiconductor pattern.

5. A semiconductor apparatus according to claim 1, wherein the first conductivity type semiconductor pattern has a greater width than that of the second conductivity type semiconductor pattern.

6. A semiconductor apparatus according to claim 1, wherein the first conductivity type semiconductor pattern has a greater thickness than that of the second conductivity type semiconductor pattern.

7. A semiconductor apparatus according to claim 1, wherein the semiconductor substrate is made of GaAs.

8. A semiconductor apparatus comprising:
   a semiconductor substrate having a device region and a periphery region surrounding the device region;
   a semiconductor device provided in the device region of the semiconductor substrate;
   a first electrode pad provided on the semiconductor substrate;
   a second electrode pad provided on the semiconductor substrate;
   a third electrode pad provided on the semiconductor substrate;
   a strip-like, first conductivity type semiconductor pattern extending in the periphery region of the semiconductor substrate and electrically connected to the first electrode pad;
   a strip-like, second conductivity type semiconductor pattern provided on the first conductivity type semiconductor pattern and constituting a p-n junction in conjunction with the first conductivity type semiconductor pattern, the second electrode pad being electrically connected to one end of the second conductivity type semiconductor pattern; and
   a first conductivity type semiconductor layer electrically connected to the third electrode pad and provided on the other end of the second conductivity type semiconductor pattern to constitute at least in part a p-n junction, thereby constituting a transistor in conjunction with the first and second conductivity type semiconductor patterns.

9. A semiconductor apparatus according to claim 8, wherein the first conductivity type semiconductor pattern is formed in a circular configuration.

10. A semiconductor apparatus according to claim 8, wherein the p-n junction formed between the first and second electrode pads has a surge protection circuit function.

11. A semiconductor apparatus according to claim 10, wherein the second conductivity type semiconductor pattern is connected to ground potential.

12. A semiconductor apparatus according to claim 8, wherein the first conductivity type semiconductor pattern has a smaller sheet resistance than that of the second conductivity type semiconductor pattern.

13. A semiconductor apparatus according to claim 8, wherein the first conductivity type semiconductor pattern has a greater width than that of the second conductivity type semiconductor pattern.

14. A semiconductor apparatus according to claim 8, wherein the first conductivity type semiconductor pattern has a greater thickness than that of the second conductivity type semiconductor pattern.

15. A semiconductor apparatus according to claim 8, wherein the semiconductor substrate is made of GaAs.

* * * * *